US008860481B1

(12) United States Patent
Illgner

(10) Patent No.: US 8,860,481 B1
(45) Date of Patent: Oct. 14, 2014

(54) REDUCING CHARGE IMBALANCE IN A CHARGE PUMP OF A PHASE LOCKED LOOP (PLL) THROUGH MAINTAINING AN OUTPUT NODE THEREOF AT A SAME VOLTAGE AS A BYPASS NODE THEREOF

(71) Applicant: Jeff Illgner, Grass Valley, CA (US)

(72) Inventor: Jeff Illgner, Grass Valley, CA (US)

(73) Assignee: GigOptix, Inc., San Jose, CA (US)

( * ) Notice: Subject to any disclaimer, the term of this patent is extended or adjusted under 35 U.S.C. 154(b) by 0 days.

(21) Appl. No.: 13/905,144

(22) Filed: May 30, 2013

(51) Int. Cl.
*H03L 7/06* (2006.01)
*H03L 7/08* (2006.01)
*H02M 3/07* (2006.01)

(52) U.S. Cl.
CPC .. *H02M 3/07* (2013.01); *H03L 7/08* (2013.01)
USPC .......................................... 327/157; 327/148

(58) Field of Classification Search
USPC ................................ 327/147–149, 156–158
See application file for complete search history.

(56) References Cited

U.S. PATENT DOCUMENTS 5,508,660 A 4/1996 Gersbach et al.
5,831,483 A 11/1998 Fukuda
6,262,610 B1 7/2001 Lo et al.
6,664,829 B1 12/2003 Hughes
7,002,416 B2 2/2006 Pettersen et al.
7,009,432 B2 3/2006 Beghein
7,081,781 B2 7/2006 Zhu et al.
8,222,933 B2 * 7/2012 Nagaraj ........................ 327/147
8,456,244 B2 * 6/2013 Obkircher et al. .............. 331/16
2002/0176188 A1 11/2002 Ruegg et al.
2007/0146025 A1 * 6/2007 Huang et al. .................. 327/156
2009/0153253 A1 * 6/2009 Mei ................................ 331/10
2011/0095794 A1 * 4/2011 Dubost et al. ................. 327/158
2011/0273210 A1 * 11/2011 Nagaraj ........................ 327/159
2012/0200327 A1 * 8/2012 Sreekiran et al. ............. 327/157
2012/0235716 A1 * 9/2012 Dubost et al. ................. 327/147
2012/0280730 A1 * 11/2012 Obkircher et al. ............ 327/157
2012/0319734 A1 * 12/2012 Nagaraj et al. .................... 327/3
2013/0154695 A1 * 6/2013 Abbasi et al. ................. 327/157
2013/0241612 A1 * 9/2013 Obkircher et al. ............ 327/157
2014/0085011 A1 * 3/2014 Choi et al. ........................ 331/8

FOREIGN PATENT DOCUMENTS

WO 2013071268 A2 5/2013

* cited by examiner

*Primary Examiner* — Adam Houston
(74) *Attorney, Agent, or Firm* — Raj Abhyanker, P.C.

(57) ABSTRACT

A method includes providing an active circuit element in a feedback path between an output node and a bypass node of a charge pump of a Phase Locked Loop (PLL). The bypass node is a node to which a charge current or a discharge current is steered to by the charge pump when neither charging the output node nor discharging the output node is required. The method also includes servoing the bypass node to the output node through the active circuit element in the feedback path to maintain a same voltage at the output node and the bypass node when neither the charging of the output node nor the discharging of the output node is required.

20 Claims, 6 Drawing Sheets

REDUCING CHARGE IMBALANCE IN A CHARGE PUMP OF A PHASE LOCKED LOOP (PLL) THROUGH MAINTAINING AN OUTPUT NODE THEREOF AT A SAME VOLTAGE AS A BYPASS NODE THEREOF

FIELD OF TECHNOLOGY

This disclosure relates generally to charge pumps of Phase Locked Loops (PLLs) and, more particularly, to reducing charge imbalance in a charge pump of a PLL through maintaining an output node thereof at a same voltage as a bypass node thereof.

BACKGROUND

A Phase Locked Loop (PLL) may be an integral part of Local Oscillator (LO) signal generation associated with a receiver (e.g., a wireless receiver). The PLL may include a charge pump to further reduce an error signal from an output of a phase detector thereof. The charge pump may also be configured to convert the error signal to analog voltage(s) applicable to a Voltage Controlled Oscillator (VCO) of the PLL. The charge pump may include an output node that is configured to be either charged or discharged. If neither charging nor discharging of the output node is required, the charge current or the discharge current may be steered to a bypass node.

The bypass node may be at a voltage that is different from that of the output node. Now, when charging occurs, a voltage-dependent charge imbalance may be caused in the charge pump due to the aforementioned difference between the voltage of the bypass node and the voltage of the output node.

SUMMARY

Disclosed are a method, a circuit and/or a system of reducing charge imbalance in a charge pump of a Phase Locked Loop (PLL) through maintaining an output node thereof at a same voltage as a bypass node thereof.

In one aspect, a method includes providing an active circuit element in a feedback path between an output node and a bypass node of a charge pump of a PLL. The bypass node is a node to which a charge current or a discharge current is steered to by the charge pump when neither charging the output node nor discharging the output node is required. The method also includes servoing the bypass node to the output node through the active circuit element in the feedback path to maintain a same voltage at the output node and the bypass node when neither the charging of the output node nor the discharging of the output node is required.

In another aspect, a PLL includes a phase detector configured to generate an output, and a charge pump configured to be controlled by the output of the phase detector. The charge pump includes an active circuit element in a feedback path between an output node and a bypass node thereof. The bypass node is a node to which a charge current or a discharge current is steered to by the charge pump when neither charging the output node nor discharging the output node is required. The bypass node is servoed to the output node through the active circuit element in the feedback path to maintain a same voltage at the output node and the bypass node when neither the charging of the output node nor the discharging of the output node is required.

In yet another aspect, a receiver includes a mixer configured to mix an input signal with a Local Oscillator (LO) signal to an Intermediate Frequency (IF), and an LO generation circuit configured to generate the LO signal. The LO generation circuit includes a PLL therein. The PLL includes a phase detector configured to generate an output, and a charge pump configured to be controlled by the output of the phase detector. The charge pump includes an active circuit element in a feedback path between an output node and a bypass node thereof. The bypass node is a node to which a charge current or a discharge current is steered to by the charge pump when neither charging the output node nor discharging the output node is required. The bypass node is servoed to the output node through the active circuit element in the feedback path to maintain a same voltage at the output node and the bypass node when neither the charging of the output node nor the discharging of the output node is required.

The methods and systems disclosed herein may be implemented in any means for achieving various aspects, and may be executed in a form of a machine-readable medium embodying a set of instructions that, when executed by a machine, cause the machine to perform any of the operations disclosed herein. Other features will be apparent from the accompanying drawings and from the detailed description that follows.

BRIEF DESCRIPTION OF THE DRAWINGS

The embodiments of this invention are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

Example embodiments, as described below, may be used to provide a method, a circuit and/or a system of reducing charge imbalance in a charge pump of a Phase Locked Loop (PLL) through maintaining an output node thereof at a same voltage as a bypass node thereof. Although the present embodiments have been described with reference to specific example embodiments, it will be evident that various modifications and changes may be made to these embodiments without departing from the broader spirit and scope of the various embodiments.

Figure 1:
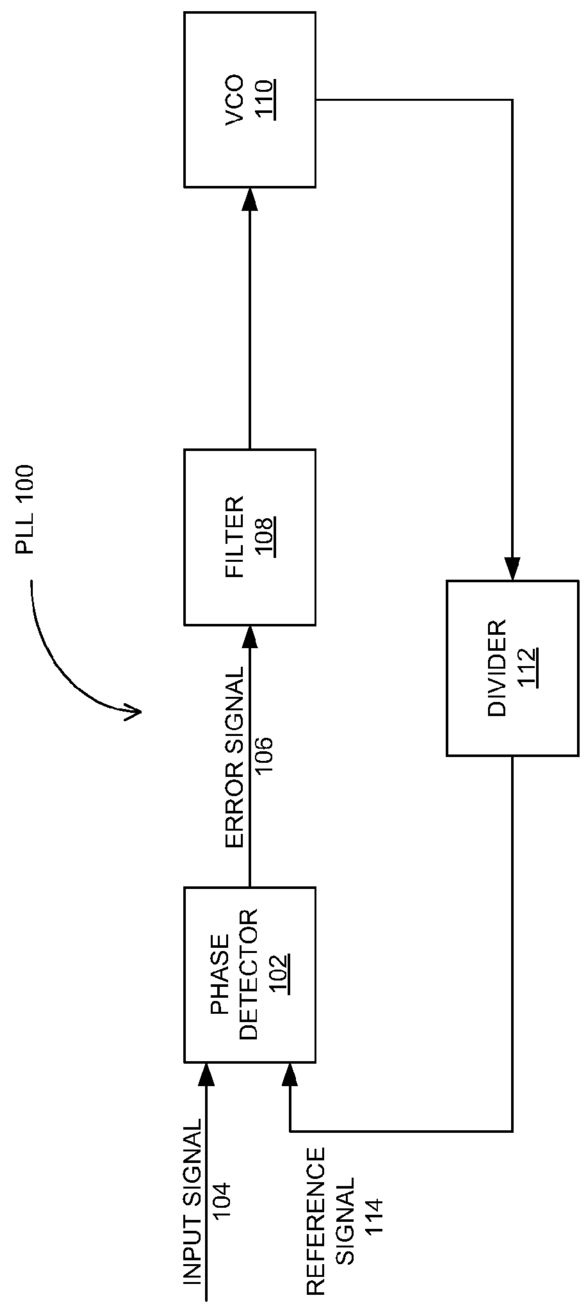
FIG. 1 is a schematic view of a Phase Locked Loop (PLL), according to one or more embodiments.

FIG. 1 shows a Phase Locked Loop (PLL) 100, according to one or more embodiments. PLL 100 may include a phase detector 102 configured to compare an input signal 104 with a reference signal (or, a feedback signal) 114 to generate an error signal 106 proportional to a phase difference therebetween. Error signal 106 may be filtered through a filter 108 to remove unwanted components therefrom. The filtered signal may be input to a Voltage Controlled Oscillator (VCO) 110 configured to generate an output signal having a frequency proportional to the filtered signal. Typically, the output signal of VCO 110 may be divided in frequency (e.g., through a divider 112) before being fed back as the reference signal (e.g., reference signal 114) to phase detector 102; alternately, the output of VCO 110 may directly be fed to phase detector 102 as reference signal 114.

Figure 2:
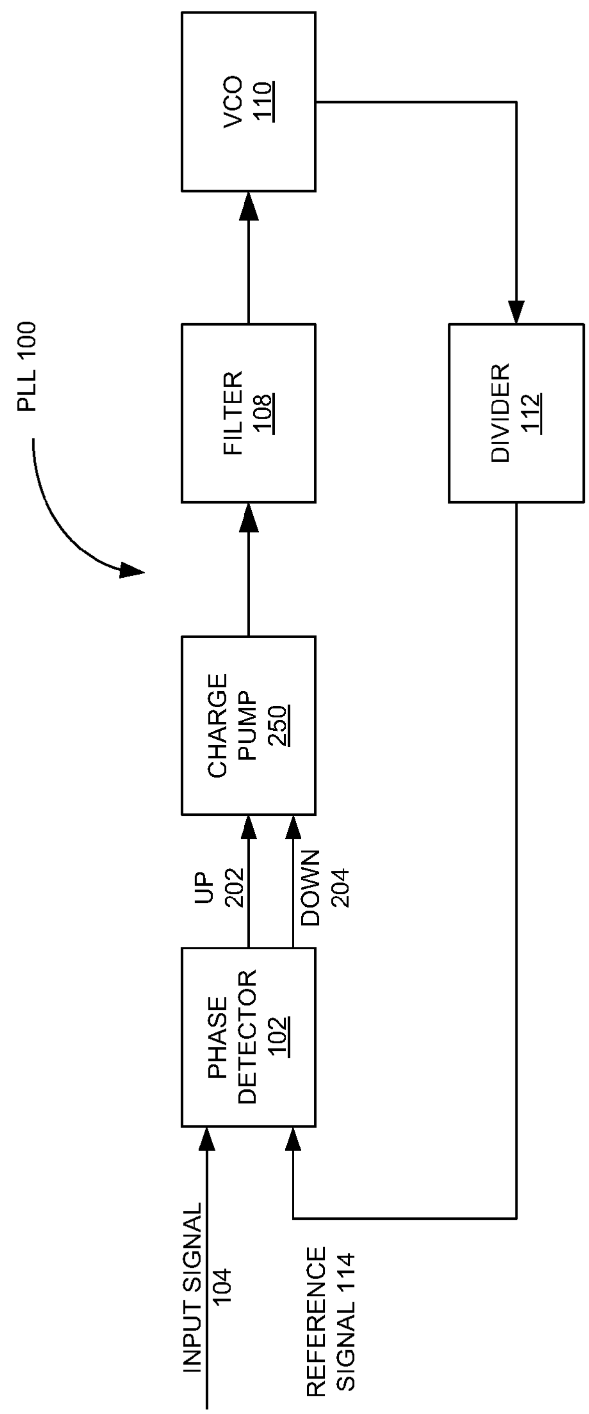
FIG. 2 is a schematic view of a PLL with a charge pump coupled between a phase detector and a filter thereof, according to one or more embodiments.

The working of PLL 100 is well known to one of ordinary skill in the art, and, therefore, detailed discussion associated therewith has been skipped for the sake of brevity and convenience. FIG. 2 shows PLL 100 with a charge pump 250 coupled between phase detector 102 and filter 108. Charge pump 250 may be configured to further reduce error signal 106; further, charge pump 250 may be configured to convert error signal 106 to analog voltage(s) applicable to VCO 110. In one example implementation, phase detector 102 may be a Phase Frequency Detector (PFD) whose outputs are UP 202 and DOWN 204 pulses; for example, phase detector 102 may output a logical 1 as UP 202 when input signal 104 arrives in a temporal past compared to reference signal 114, and may output a logical 1 as DOWN 204 when input signal 104 arrives in a temporal future compared to reference signal 114. Relevant implementations of PFD are known to one skilled in the art; therefore, detailed discussion associated therewith is skipped for the sake of convenience and brevity.

Figure 3:
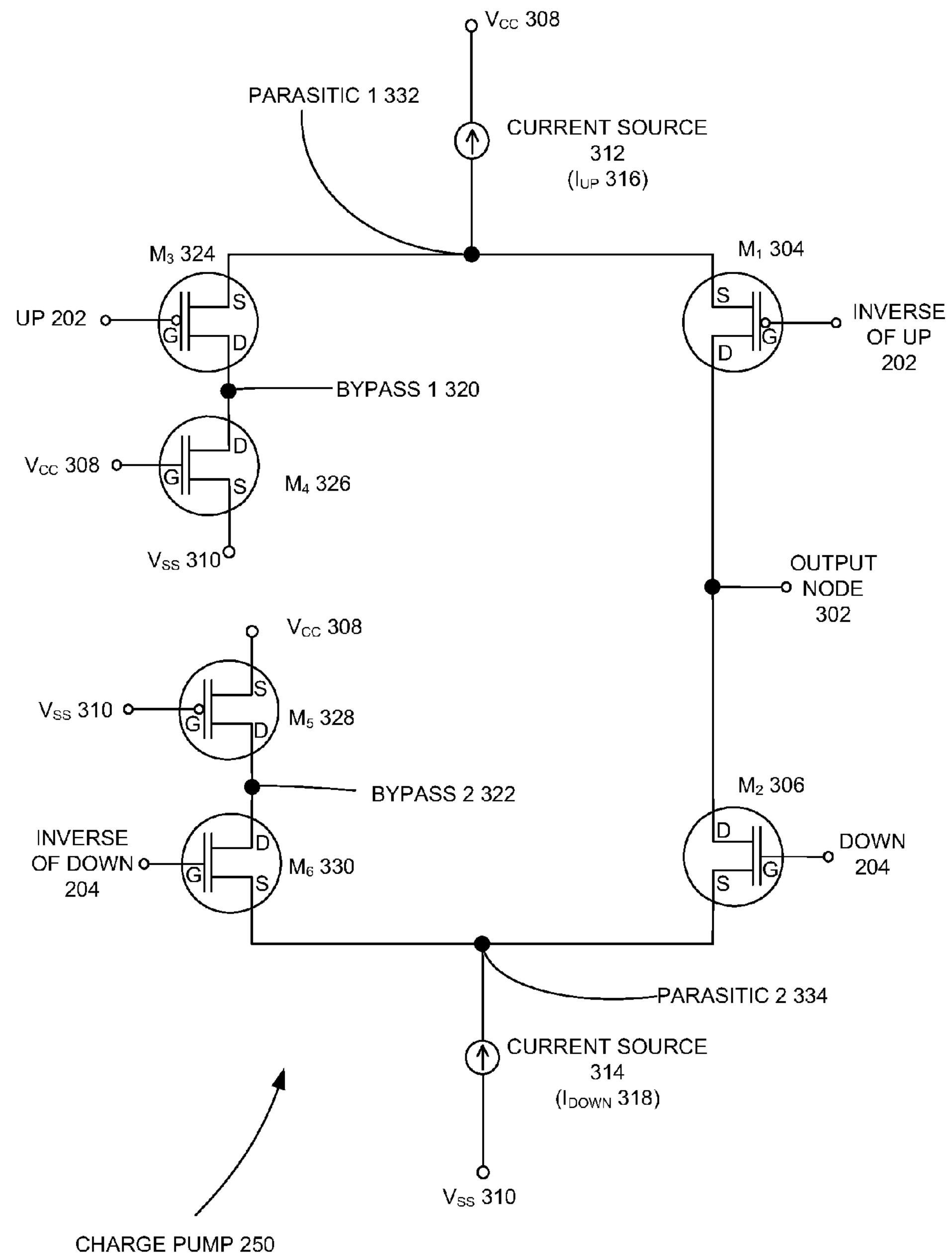
FIG. 3 is a circuit view of the charge pump of the PLL of FIG. 2.

FIG. 3 shows charge pump 250 utilized in PLL 100 in detail. Charge pump 250 may be controlled by the outputs of phase detector 102 discussed above. Here, charge pump 250 may steer a current to either charge an output node 302 thereof through a transistor $M_1$ 304 (e.g., a p-channel Metal-Oxide-Semiconductor (pMOS) transistor) or discharge output node 302 through a transistor $M_2$ 306 (e.g., an n-channel MOS (nMOS) transistor). $M_1$ 304 and $M_2$ 306 may serve as switches that are ON or OFF depending on whether UP 202 or DOWN 204 is correspondingly a logical "1" or not (or, "0" or not, depending on the implementation). $M_1$ 304 and $M_2$ 306 may be coupled to one another (e.g., through corresponding drain (D) terminals thereof) and output node 302 may be taken from a path coupling $M_1$ 304 and $M_2$ 306.

FIG. 3 shows charge pump 250 being held between power supply $V_{CC}$ 308 and $V_{SS}$ 310 (e.g., ground voltage, a lower voltage than $V_{CC}$ 308). Current sources (312, 314) may be coupled to $V_{CC}$ 308 and $V_{SS}$ 310 respectively; preferably, current source 312 and current source 314 may deliver a same current (e.g., $I_{UP}$ 316 and $I_{DOWN}$ 318 associated with current source 312 and current source 314 respectively). If neither charging nor discharging of output node 302 is required, equal charge and discharge currents are steered to bypass nodes (e.g., BYPASS 1 320 and BYPASS 2 322) configured to include one or more circuit elements to provide for a corresponding one or more voltage drops thereacross. In the example charge pump 250 shown in FIG. 3, BYPASS 1 320 may include transistors $M_3$ 324 and $M_4$ 326, analogous to $M_1$ 304 and $M_2$ 306. Analogously, BYPASS 2 322 may include transistors $M_5$ 328 and $M_6$ 330; transistors $M_3$ 324 and $M_5$ 328 may be pMOS transistors and transistors $M_4$ 326 and $M_6$ 330 may be nMOS transistors.

It is to be noted that an inverted UP 202 may be applied to a gate (G) terminal of $M_1$ 304 and DOWN 204 may be applied to a gate (G) terminal of $M_2$ 306. Further, UP 202 may be applied to a gate (G) terminal of $M_3$ 324, $V_{CC}$ 308 may be applied to a gate (G) terminal of $M_4$ 326, $V_{SS}$ 310 may be applied to a gate (G) terminal of $M_5$ 328 and an inverted DOWN 204 may be applied to a gate (G) terminal of $M_6$ 330. The source (S) terminals of $M_4$ 326 and $M_5$ 328 may be held at $V_{SS}$ 310 and $V_{CC}$ 308 respectively. Working of charge pump 250 is well known to one skilled in the art; therefore, detailed discussion associated therewith has been skipped for the sake of convenience and brevity. It should be noted that the above-mentioned transistor-terminal connections are implementation-specific and do not serve to limit the exemplary embodiments discussed herein.

As BYPASS 1 320 and BYPASS 2 322 are at different voltages than output node 302, PN junctions thereof may contribute to charge imbalance in charge pump 250, leading to distortion in PLL 100 of which charge pump 250 is part of. For example, when no charging or discharging occurs, i.e., when $M_3$ 324 and $M_6$ 330 are ON and $M_1$ 304 and $M_2$ 306 are OFF, BYPASS 1 320 (and BYPASS 2 322) is at a different voltage as compared to the voltage at output node 302. Similarly, the voltages at the output of current source 312 and current source 314, viz. PARASITIC 1 332 (and PARASITIC 2 334) respectively, are also different as compared to the voltage at output node 302.

Now, if charging occurs, $M_1$ 304 may turn ON and $M_3$ 324 may turn OFF; momentarily, node PARASITIC 1 332 may share charge with output node 302. Therefore, a voltage-dependent charge imbalance may be a feature of charge pump 250 arising from the voltage difference between PARASITIC 1 332 and output node 302.

Figure 4:
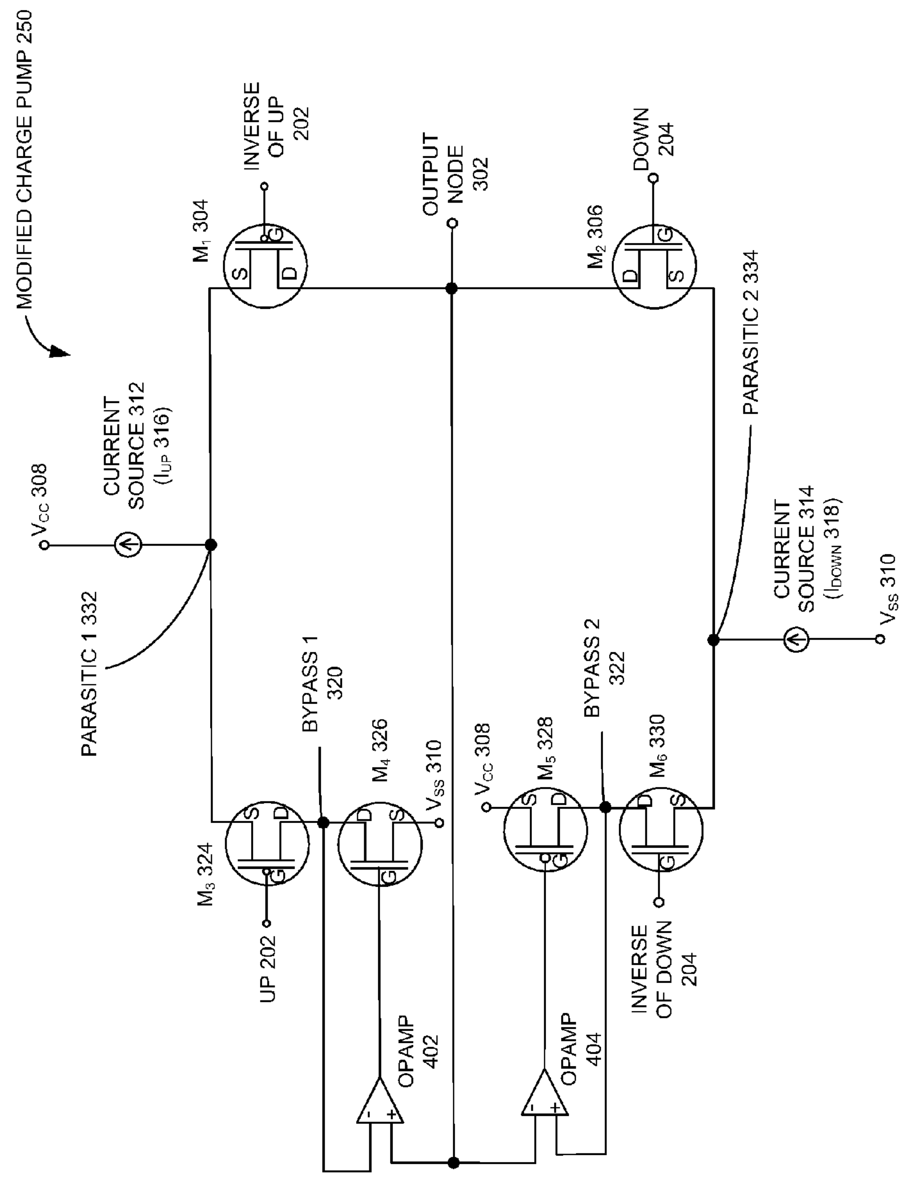
FIG. 4 is a circuit view of a modified charge pump of FIG. 3 based on servoing a bypass node thereof to an output node thereof, according to one or more embodiments.

FIG. 4 shows a modification of charge pump 250 based on servoing each of BYPASS 1 320 and/or BYPASS 2 322 to output node 302, according to one or more embodiments. In one or more embodiments, the servoing may involve a feedback mechanism, wherein an active circuit element is utilized in a feedback loop between output node 302 and BYPASS 1 320 (and/or BYPASS 2 322) to maintain BYPASS 1 320 (and/or BYPASS 2 322) at the same voltage as output node 302 when no charging or discharging occurs through $M_1$ 304 or $M_2$ 306. FIG. 4 shows the active circuit element being used in the feedback loop as operational amplifiers (OPAMP 402 and OPAMP 404). Each of OPAMP 402 and OPAMP 404 may be configured to receive a voltage from output node 302 and a voltage from BYPASS 1 320/BYPASS 2 322 as inputs thereof. The outputs of OPAMP 402 and OPAMP 404 are configured to be applied to the gate (G) terminals of $M_4$ 326 and $M_5$ 328 respectively.

In one or more embodiments, when no charging or discharging occurs as discussed with reference to FIG. 3, OPAMP 402 and/or OPAMP 404 may maintain BYPASS 1 320 (and PARASITIC 1 332) and/or BYPASS 2 322 (and PARASITIC 2 334) respectively at a same voltage as output node 302. In one or more embodiments, now if charging occurs and $M_1$ 304 turns ON and $M_3$ 324 turns OFF, PARASITIC 1 332 may already be at the same voltage as output node 302. Therefore, in one or more embodiments, charge imbalance is not a factor in the aforementioned transition due to there being no difference between the voltages.

It is obvious that the active circuit elements utilized in the abovementioned servoing are not limited to operational amplifiers. Other active circuit elements and/or alternate implementations are within the scope of the exemplary embodiments. In one or more embodiments, modified charge pump 250 may provide for improved performance in PLL 100 of which modified charge pump 250 is a part of.

Figure 5:
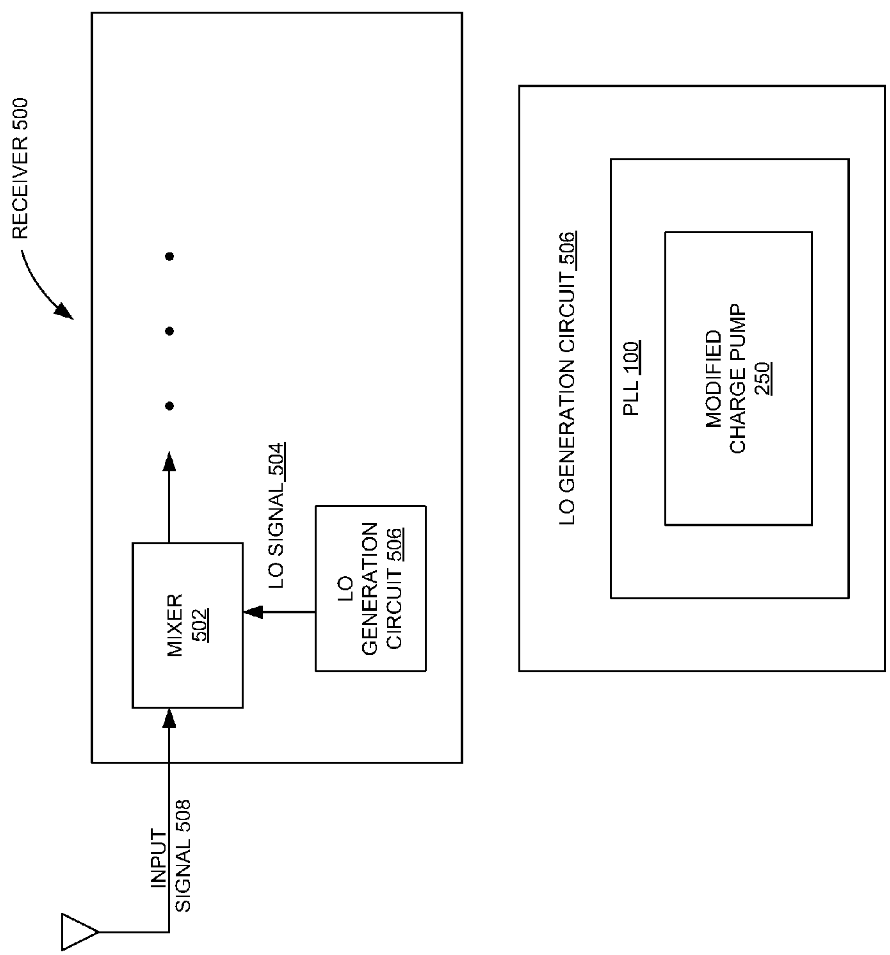
FIG. 5 is a schematic view of a receiver including a Local Oscillator (LO) generation circuit incorporating the PLL of FIG. 2 and the modified charge pump of FIG. 4, according to one or more embodiments.

FIG. 5 shows a receiver 500 of which PLL 100 is a part of, according to one or more embodiments. In one or more embodiments, receiver 500 may include a mixer 502 configured to mix a Local Oscillator (LO) signal 504 generated from an LO generation circuit 506 with an input signal 508 thereto to an Intermediate Frequency (IF). It is obvious that input signal 508 may be amplified prior to being mixed at mixer 502. In one or more embodiments, PLL 100, along with modified charge pump 250 of FIG. 4, may be part of LO generation circuit 506. The parts and functions of receiver 500 are well known to one of ordinary skill in the art; therefore, detailed discussion associated therewith has been skipped for the sake of convenience and brevity.

Figure 6:
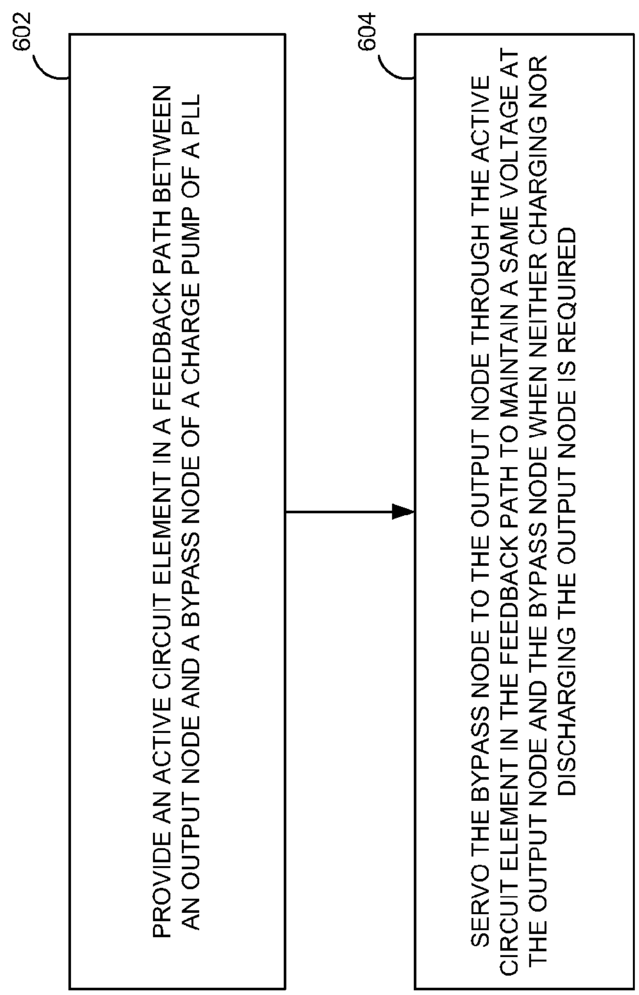
FIG. 6 is a process flow diagram detailing the operations involved in reducing charge imbalance in the modified charge pump of FIG. 4 of the PLL of FIG. 2 through maintaining the output node at a same voltage as the bypass node, according to one or more embodiments.

FIG. 6 shows a process flow diagram detailing the operations involved in reducing charge imbalance in modified charge pump 250 of PLL 100 through maintaining output node 302 at a same voltage as a bypass node (e.g., BYPASS 1 320, BYPASS 2 322), according to one or more embodiments. In one or more embodiments, operation 602 may involve providing an active circuit element (e.g., OPAMP 402, OPAMP 404) in a feedback path between output node 302 and the bypass node of modified charge pump 250 of PLL 100. In one or more embodiments, the bypass node may be a node to which a charge current or a discharge current is steered to by modified charge pump 250 when neither charging output node 302 nor discharging output node 302 is required. In one or more embodiments, operation 604 may then involve servoing the bypass node to output node 302 through the active circuit element in the feedback path to maintain a same voltage at output node 302 and the bypass node when neither the charging of output node 302 nor the discharging of output node 302 is required.

Although the present embodiments have been described with reference to specific example embodiments, it will be evident that various modifications and changes may be made to these embodiments without departing from the broader spirit and scope of the various embodiments. For example, the various devices and modules described herein may be enabled and operated using hardware circuitry, firmware, software or any combination of hardware, firmware, and software (e.g., embodied in a non-transitory machine-readable medium). For example, the various electrical structure and methods may be embodied using transistors, logic gates, and electrical circuits (e.g., Application Specific Integrated Circuitry (ASIC) and/or Digital Signal Processor (DSP) circuitry).

Accordingly, the specification and drawings are to be regarded in an illustrative rather than a restrictive sense.

What is claimed is:

1. A method comprising:

providing an active circuit element in a feedback path between an output node and a bypass node of a charge pump of a Phase Locked Loop (PLL), the bypass node being a node to which one of a charge current and a discharge current is steered to by the charge pump when neither charging the output node nor discharging the output node is required; and servoing the bypass node to the output node through the active circuit element in the feedback path to maintain a same voltage at the output node and the bypass node when neither the charging of the output node nor the discharging of the output node is required.

2. The method of claim 1, comprising providing an operational amplifier as the active circuit element in the feedback path, the operational amplifier being configured to receive a voltage from the output node and a voltage from the bypass node as inputs thereto.

3. The method of claim 1, comprising providing a pair of transistors in a path comprising the bypass node, the bypass node being taken from a path coupling a transistor of the pair to another transistor thereof.

4. The method of claim 1, further comprising:

providing a first transistor configured to function as a switch in a path enabling the charging of the output node;

providing a second transistor also configured to function as a switch in a path enabling the discharging of the output node; and controlling the charging and the discharging of the output node based on an output of a phase detector of the PLL.

5. The method of claim 4, wherein the first transistor and the second transistor are Metal-Oxide-Semiconductor (MOS) transistors configured to have a voltage associated with the output of the phase detector applied to gate terminals thereof.

6. The method of claim 3, wherein the pair of transistors in the path comprising the bypass node includes a MOS transistor pair.

7. The method of claim 4, further comprising:

providing the active circuit element in each of a feedback path between the output node and the bypass node associated with the first transistor and a feedback path between the output node and the bypass node associated with the second transistor;

coupling a current source associated with the first transistor to a first supply voltage; and coupling another current source associated with the second transistor to a second supply voltage less than the first supply voltage, the second supply voltage also capable of being a ground voltage.

8. A PLL comprising:

a phase detector configured to generate an output; and a charge pump configured to be controlled by the output of the phase detector, the charge pump comprising an active circuit element in a feedback path between an output node and a bypass node thereof, the bypass node being a node to which one of a charge current and a discharge current is steered to by the charge pump when neither charging the output node nor discharging the output node is required, wherein the bypass node is servoed to the output node through the active circuit element in the feedback path to maintain a same voltage at the output node and the bypass node when neither the charging of the output node nor the discharging of the output node is required.

9. The PLL of claim 8, wherein the active circuit element in the feedback path between the output node and the bypass node of the charge pump is an operational amplifier configured to receive a voltage from the output node and a voltage from the bypass node as inputs thereto.

10. The PLL of claim 8, wherein a path comprising the bypass node of the charge pump includes a pair of transistors, the bypass node being taken from a path coupling a transistor of the pair to another transistor thereof.

11. The PLL of claim 8, wherein the charge pump further comprises:

a first transistor configured to function as a switch in a path enabling the charging of the output node; and a second transistor also configured to function as a switch in a path enabling the discharging of the output node, wherein the charging and the discharging of the output node are configured to be controlled based on the output of the phase detector.

12. The PLL of claim 11, wherein the first transistor and the second transistor of the charge pump are MOS transistors configured to have a voltage associated with the output of the phase detector applied to gate terminals thereof.

13. The PLL of claim 10, wherein the pair of transistors in the path comprising the bypass node of the charge pump includes a MOS transistor pair.

14. The PLL of claim 11, wherein the active circuit element is provided in each of a feedback path between the output node and the bypass node associated with the first transistor of the charge pump and a feedback path between the output node and the bypass node associated with the second transistor of the charge pump, and wherein the charge pump further comprises a current source associated with the first transistor coupled to a first supply voltage and another current source associated with the second transistor coupled to a second supply voltage less than the first supply voltage, the second supply voltage also capable of being a ground voltage.

15. A receiver comprising:

a mixer configured to mix an input signal with a Local Oscillator (LO) signal to an Intermediate Frequency (IF); and an LO generation circuit configured to generate the LO signal, the LO generation circuit including a PLL therein, the PLL comprising:

a phase detector configured to generate an output; and a charge pump configured to be controlled by the output of the phase detector, the charge pump comprising an active circuit element in a feedback path between an output node and a bypass node thereof, the bypass node being a node to which one of a charge current and a discharge current is steered to by the charge pump when neither charging the output node nor discharging the output node is required, wherein the bypass node is servoed to the output node through the active circuit element in the feedback path to maintain a same voltage at the output node and the bypass node when neither the charging of the output node nor the discharging of the output node is required.

16. The receiver of claim 15, wherein the active circuit element in the feedback path between the output node and the bypass node of the charge pump is an operational amplifier configured to receive a voltage from the output node and a voltage from the bypass node as inputs thereto.

17. The receiver of claim 15, wherein a path comprising the bypass node of the charge pump includes a pair of transistors, the bypass node being taken from a path coupling a transistor of the pair to another transistor thereof.

18. The receiver of claim 15, wherein the charge pump further comprises:

a first transistor configured to function as a switch in a path enabling the charging of the output node; and a second transistor also configured to function as a switch in a path enabling the discharging of the output node, wherein the charging and the discharging of the output node are configured to be controlled based on the output of the phase detector.

19. The receiver of claim 18, wherein the first transistor and the second transistor of the charge pump are MOS transistors configured to have a voltage associated with the output of the phase detector applied to gate terminals thereof.

20. The receiver of claim 17, wherein the pair of transistors in the path comprising the bypass node of the charge pump includes a MOS transistor pair.

* * * * *